(12) United States Patent
Lee et al.

(10) Patent No.: US 7,393,720 B2
(45) Date of Patent: Jul. 1, 2008

(54) METHOD FOR FABRICATING ELECTRICAL INTERCONNECT STRUCTURE

(75) Inventors: Shao-Chien Lee, Taoyuan County (TW); Tzyy Jang Tseng, Hsinchu (TW); Chang-Ming Lee, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 311 days.

(21) Appl. No.: 10/905,931

(22) Filed: Jan. 27, 2005

(65) Prior Publication Data

US 2006/0068577 A1  Mar. 30, 2006

(30) Foreign Application Priority Data

Sep. 29, 2004  (TW) .............................. 93129344 A

(51) Int. Cl.
 *H01L 21/31* (2006.01)
(52) U.S. Cl. ................ 438/128; 438/622; 257/E23.169
(58) Field of Classification Search ................. 438/128, 438/622
 See application file for complete search history.

(56) References Cited

U.S. PATENT DOCUMENTS

2004/0091821 A1* 5/2004 Appelt et al. ............... 430/319

FOREIGN PATENT DOCUMENTS

| JP | 63-208298 | 8/1988 |
|---|---|---|
| JP | 2002-185097 | 6/2002 |
| JP | 2002374068 | 12/2002 |
| JP | 2003-008228 | 1/2003 |
| JP | 2003017855 | 1/2003 |
| JP | 2004-047587 | 2/2004 |
| TW | 580848 | 3/2004 |
| WO | 01/039561 | 5/2001 |
| WO | WO0139561 | 5/2001 |

* cited by examiner

*Primary Examiner*—Alexander Ghyka
(74) *Attorney, Agent, or Firm*—Jianq Chyun IP Office

(57) ABSTRACT

A method for fabricating an electrical interconnect structure is adapted for a circuit board manufacturing process. The circuit board comprises a conductive substrate, which comprises a first conductive layer and a bump conductive layer. The bump conductive layer is patterned to form at least one bump over the first conductive layer. Then, a dielectric layer is formed over the first conductive layer and the bump. A second conductive layer is formed over the dielectric layer. At least one blind hole is formed in the second conductive layer and the dielectric layer, passing through the second conductive layer and the dielectric layer to expose the top surface of the bump. A conductive material is filled in the blind hole, and the conductive material in the blind hole and the bump constitute a conductive post.

11 Claims, 7 Drawing Sheets

METHOD FOR FABRICATING ELECTRICAL INTERCONNECT STRUCTURE

CROSS-REFERENCE TO RELATED APPLICATION

This application claims the priority benefit of Taiwan application serial no. 93129344, filed Sep. 29, 2004.

BACKGROUND OF THE INVENTION

1. Field of the Invention

The present invention relates to a method for fabricating an electrical interconnect structure, and more particularly to a method for fabricating an electrical interconnect structure adapted for a circuit board manufacturing process.

2. Description of the Related Art

A circuit board is composed of a plurality of patterned circuit layers and a plurality of dielectric layers which are alternatively stacked on each other. In addition, methods of forming a circuit board include a laminating process and a build-up process. Either of these methods uses conductive vias to electrically connect these patterned circuit layers. Based on manufacturing process and structure, conductive vias can be divided into conductive through vias and conductive micro vias. According to corresponding locations of micro vias in the circuit board, micro vias can be divided into conductive embedded vias and conductive blind vias.

Note that in the method of forming either conductive vias or conductive micro vias, an electroplating layer is formed on sidewalls of openings inside a dielectric layer or a stacked layer to electrically connect conductive layers on two surfaces of the dielectric layer or the stacked layer. However, the electroplating layer described above only forms hollow conductive structures, i.e. conductive vias or micro conductive vias, in sidewalls of openings inside the dielectric layer or the stacked layer. These hollow structures cannot provide desired electrical performance and heat dissipation efficiency required for current circuit boards. The via-filling-plating technique, therefore, is provided, where conductive material is filled in openings described above to form conductive posts to replace the conventional hollow conductive structures (i.e. conductive through vias and conductive micro vias). Accordingly, the via-filling-plating technique is applied to improve electrical performance and heat dissipation efficiency of circuit boards.

FIG. 1A is a cross-sectional view showing a conventional electrical interconnect with a conductive through via. The electrical interconnect structure 100a is adapted for a circuit board. The electrical interconnect structure 100a comprises a dielectric layer 110, which is made of such materials as epoxy resin or epoxy resin comprising glass fiber. A first conductive layer 120, such as a copper foil, is formed on the first surface 112 of the dielectric layer 110. A second conductive layer 130, such as a copper foil, is formed over the second surface 114 of the dielectric layer 110, which is opposite to the first surface 112.

In order to electrically connect the first conductive layer 120 with the second conductive layer 130 separated by the dielectric layer 110, the conventional technique applies a drilling process to form at least one through hole 102 in the dielectric layer 110, the first conductive layer 120 and the second conductive layer 130. An electroplating process is then performed to deposit an electroplating layer 140 covering the sidewall of the through hole 102 and surfaces of the first conductive layer 120 and the second conductive layer 130. Wherein, a portion of the electroplating layer 140 fully fills the space formed by the through hole 102 to form a solid post of conductive through via 142. Because the conductive through via 142 has a greater cross-sectional area for heat dissipation, electrical performance and heat dissipation efficiency of the electrical interconnect structure 100a are thus enhanced.

FIG. 1B is a cross-sectional view showing a conventional electrical interconnect with a defective conductive through via. During an electroplating process, since point discharging may easily occur at edges of the through hole 102, the edge 120a of the first conductive layer 120 and the edge 130a of the second conductive layer 130 may generate great point discharge current such that deposition materials of the conductive material will deposit on the edge 120a of the first conductive layer 120 and the edge 130a of the second conductive layer 130 first. As a result, where the deposition material of the conductive material on the edge 120a of the first conductive layer 120 and the edge 130a of the second conductive layer 130 extend towards the center of the through hole 102, a void 142a may be formed in the solid post of conductive through via 142, which is formed by a portion of the electroplating layer 140 filling the through hole 102.

FIG. 2A is a cross-sectional view showing a conventional electrical interconnect with a conductive micro via. The electrical interconnect structure 200a is adapted for a circuit board. The electrical interconnect structure 200a comprises a dielectric layer 210 and a conductive layer 220. The dielectric layer 210 is stacked over the conductive layer 220. Wherein, the dielectric layer 210 is made of such materials as epoxy resin or epoxy resin comprising glass fiber, and the conductive layer 220 can be, for example, a copper foil. The conventional method for fabricating a conductive micro via comprises a drilling process to form at least one opening 202 in the dielectric layer 210. An electroplating process is then performed to deposit an electroplating layer 240 covering the sidewall of the opening 202 and surface of the dielectric layer 210. Wherein, a portion of the electroplating layer 240 fills the space formed by the opening 202 to form a solid post of conductive micro via 242.

FIG. 2B is a cross-sectional view showing a conventional electrical interconnect with a defective conductive micro via. During an electroplating process, similar to the through hole 102 in FIG. 1B, point discharge easily occurs at two edges of the opening 202. Accordingly, a void 242a is formed in the conductive micro via 242, which is formed by a portion of the electroplating layer 240.

From the descriptions above, these voids 142a and 242a are formed in these conductive through via 142 and conductive micro via 242, respectively, due to point discharge during the electroplating process. These voids 142a and 242a will reduce cross-sectional areas of the conductive through via 142 and conductive micro via 242, respectively. As a result, electrical performance and heat dissipation efficiency of these electrical interconnect structures 100b and 200b will decline.

SUMMARY OF THE INVENTION

Accordingly, the present invention is directed to a method for fabricating an electrical interconnect structure adapted for a circuit board manufacturing process, capable of improving the yield of fabricating conductive posts on the circuit board.

In order to achieve the object described above, the present invention provides a method for fabricating an electrical interconnect structure adapted for a circuit board manufacturing process. The circuit board comprises a conductive substrate, divided into a first conductive layer and a bump conductive layer. The bump conductive layer is disposed over the first conductive layer. The method comprises patterning the bump conductive layer to form at least one bump over the first conductive layer. A dielectric layer is formed over the first conductive layer and the bump, and the dielectric layer covers a top surface of the bump. A second conductive layer is formed over the dielectric layer. At least one blind hole is formed in the second conductive layer and the dielectric layer. The blind hole passes through the second conductive layer and dielectric layer to expose the top surface of the bump. A conductive material is filled in the blind hole, and the conductive material in the blind hole and the bump constitute a conductive post.

According to the method for fabricating an electrical interconnect structure of an embodiment of the present invention, the blind hole is formed by mechanical drilling, laser ablating or plasma etching.

According to the method for fabricating an electrical interconnect structure of an embodiment of the present invention, the conductive material is filled in the blind hole by electroplating.

In order to achieve the object described above, the present invention provides another method for fabricating an electrical interconnect structure adapted for a circuit board manufacturing process. The circuit board comprises a first conductive layer. The method comprises forming at least one bump over the first conductive layer. A dielectric layer is then formed over the first conductive layer and the bump, and the dielectric layer covers a top surface of the bump. A second conductive layer is formed over the dielectric layer. At least one blind hole is formed in the second conductive layer and the dielectric layer. The blind hole passes through the second conductive layer and dielectric layer to expose the top surface of the bump. A conductive material is filled in the blind hole, and the conductive material in the blind hole and the bump constitute a conductive post.

According to the method for fabricating an electrical interconnect structure of an embodiment of the present invention, before the bump is formed over the first conductive layer, the first conductive layer is patterned.

According to the method for fabricating an electrical interconnect structure of an embodiment of the present invention, the blind hole is formed by a mechanical drilling method, a laser ablating method or a plasma etching method.

According to the method for fabricating an electrical interconnect structure of an embodiment of the present invention, the conductive material is filled in the blind hole by an electroplating method.

According to the descriptions above, in the method for fabricating the electrical interconnect structure, the conductive post formed by the bump and the conductive material in the blind hole is used to electrically connect two conductive layers separated by the dielectric layer. Compared with the conventional method for forming a conductive post, in the present invention, a bump is formed over the conductive layer first as a bottom part of the conductive post. The top part of the conductive post is formed by filling the conductive material in the blind hole in the dielectric layer. Accordingly, for a conductive post with a constant height, the higher the bump is, the shallower the blind hole is. A shallow blind hole not only reduces the time for electroplating, but also decreases the possibility of voids formed within the conductive post. Accordingly, the yield of conductive posts is enhanced.

The above and other features of the present invention will be better understood from the following detailed description of the embodiments of the invention that is provided in communication with the accompanying drawings.

DESCRIPTION OF SOME EMBODIMENTS

First Embodiment

Figure 1A:
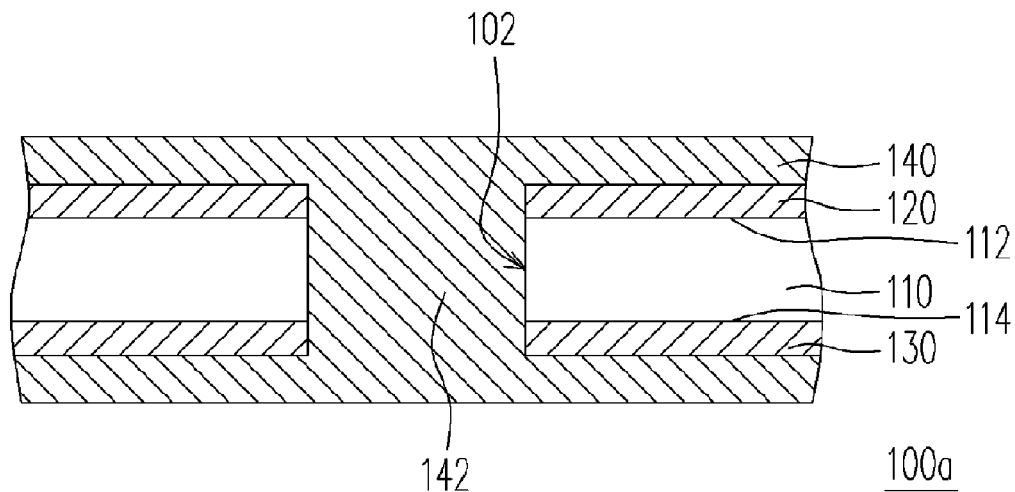
FIG. 1A is a cross-sectional view showing a conventional electrical interconnect with a conductive through via.
Figure 1B:
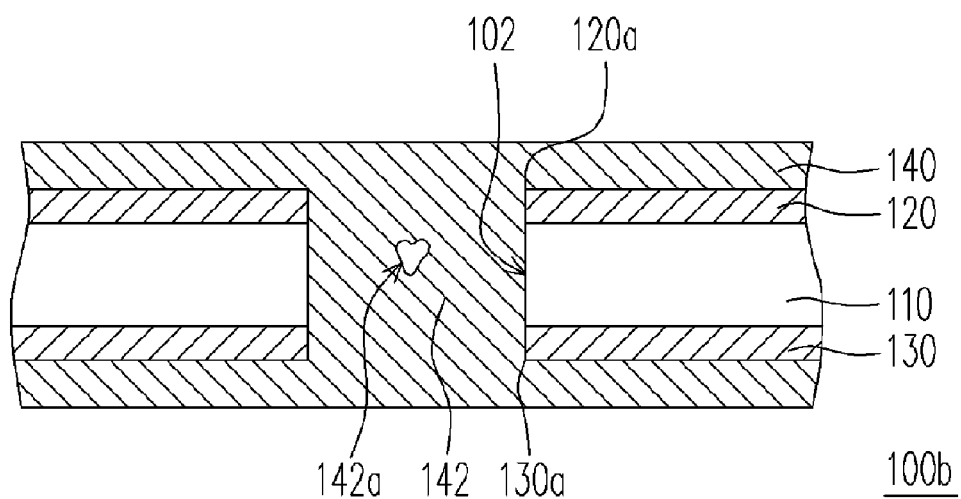
FIG. 1B is a cross-sectional view showing a conventional electrical interconnect with a defective conductive through via.
Figure 2A:
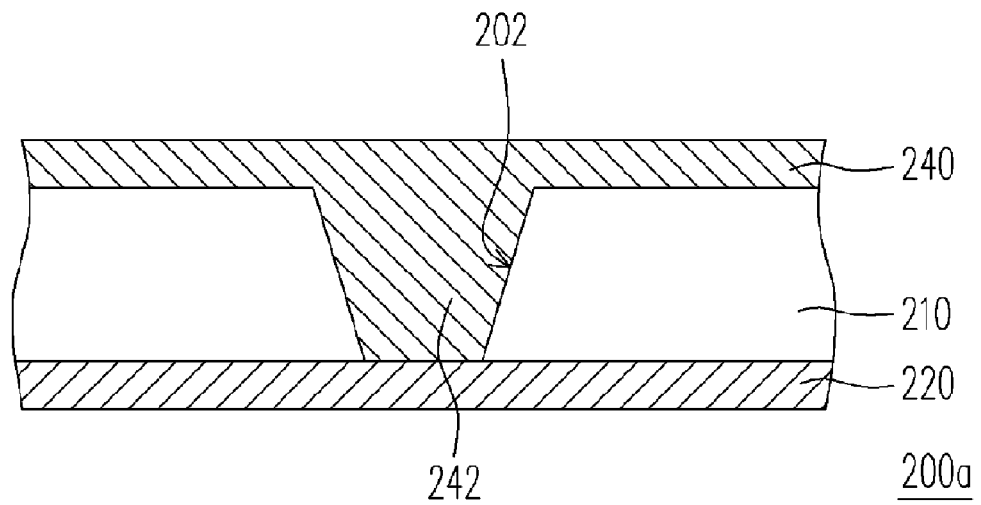
FIG. 2A is a cross-sectional view showing a conventional electrical interconnect with a conductive micro via.
Figure 2B:
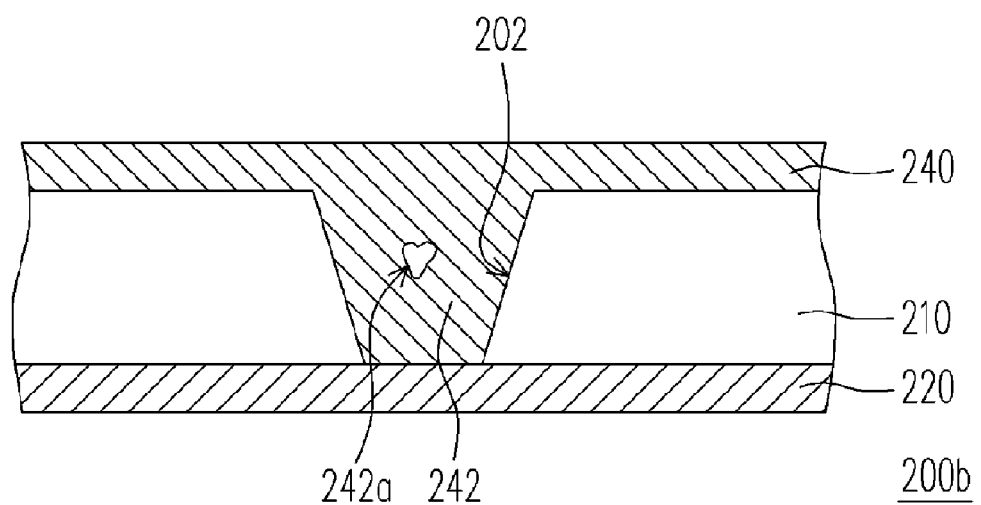
FIG. 2B is a cross-sectional view showing a conventional electrical interconnect with a defective conductive micro via.
Figure 3A:
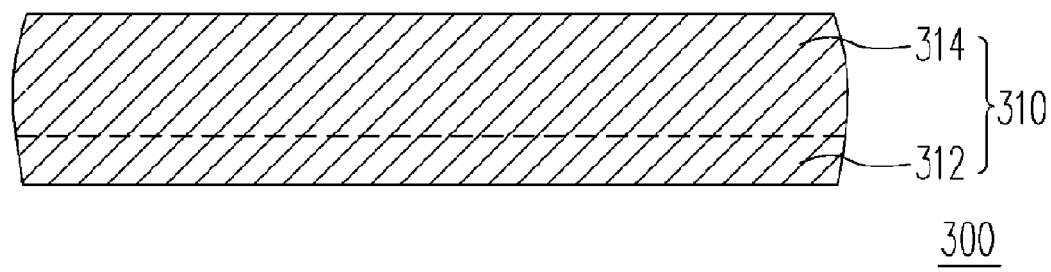
FIGS. 3A-3F are cross-sectional views showing progression of a method for fabricating an electrical interconnect structure according to a first embodiment of the present invention.

FIGS. 3A-3F are cross-sectional views showing progression of a method for fabricating an electrical interconnect structure according to a first embodiment of the present invention. Referring to FIG. 3A, the method for fabricating an electrical interconnect structure of the present invention is adapted for a circuit board manufacturing process. The method comprises providing a conductive substrate 310. The conductive substrate 310 is divided into a first conductive layer 312 and a bump conductive layer 314. The bump conductive layer 314 is disposed over the first conductive layer 312. In addition, the material of the conductive substrate 310 can be, for example, copper.

Figure 3B:
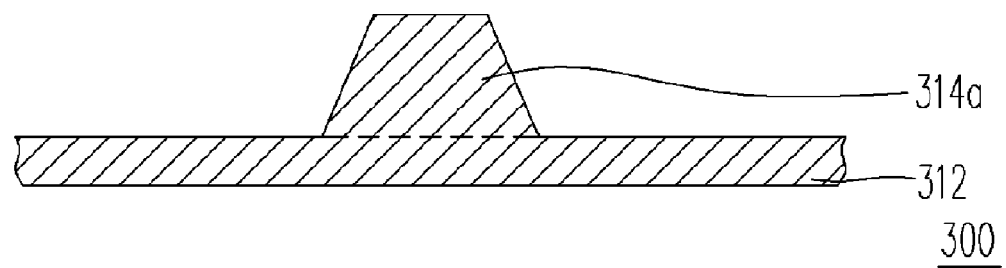

Referring to FIG. 3B, the bump conductive layer 314 is patterned, wherein the method of patterning the bump conductive layer 314 can be, for example, a photolithographic process and an etching process to form at least one bump 314a over the first conductive layer 312.

Figure 3C:
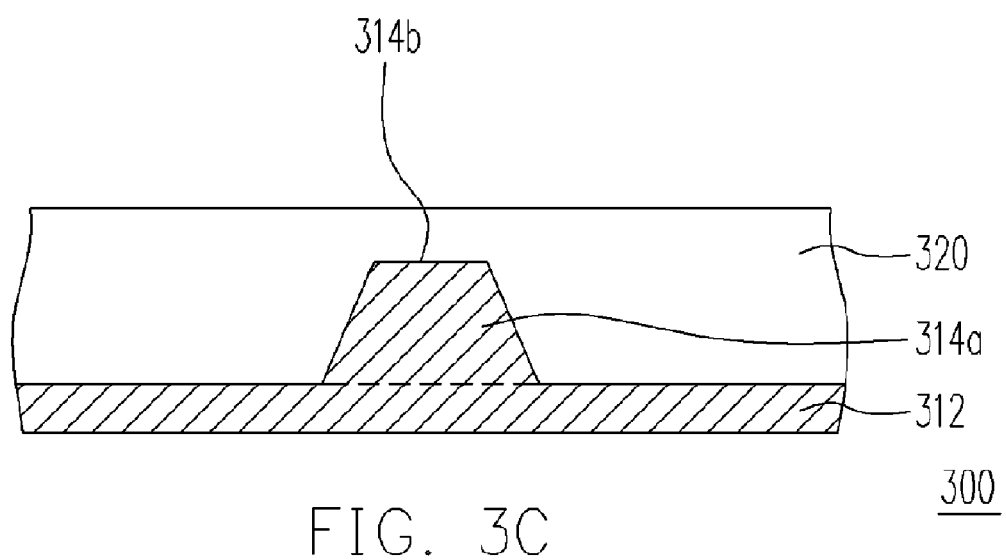

Referring to FIG. 3C, a dielectric layer 320 is formed over the first conductive layer 312 and the bump 314a. The dielectric layer 320 covers a top surface 314b of the bump 314a, wherein the material of the dielectric layer 320 can be, for example, epoxy resin or epoxy resin comprising glass fiber. In addition, the method for forming the dielectric layer 320 can be, for example, a film adhesion method, a thermal laminating method, or a coating-and-solidification method.

Figure 3D:
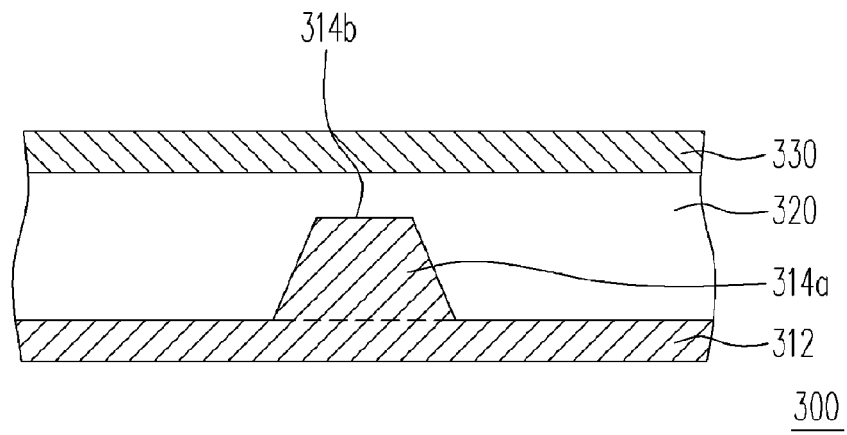

Referring to FIG. 3D, a second conductive layer 330 can be formed over the dielectric layer 320 by, for example, an electroplating method. The material of the second conductive layer 330 can be copper. In addition, the dielectric layer 320 and the second conductive layer 330 can be formed together by using resin coating copper (RCC).

Figure 3E:
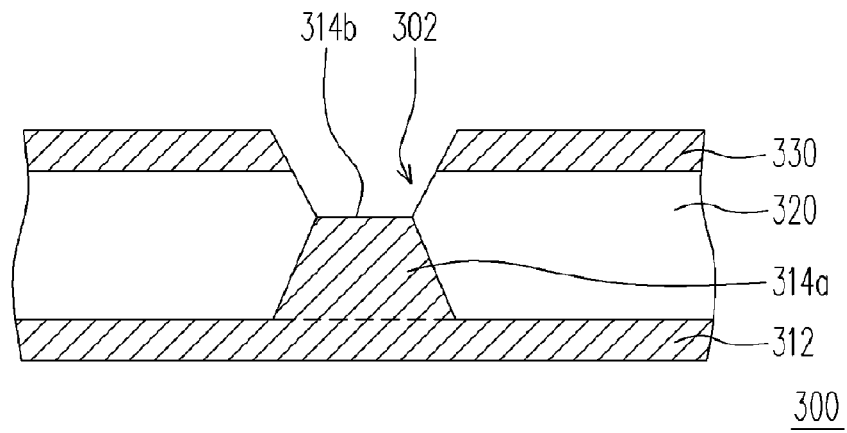

Referring to FIG. 3E, at least one blind hole 302 can be formed in the second conductive layer 330 and the dielectric layer 320 by, for example, a mechanical drilling method, a laser ablating method, or a plasma etching method. Moreover, the blind hole 302 passes through the second conductive layer 330 and the dielectric layer 320 to expose the top surface 314b of the bump 314a. Note that the blind hole 302 can be formed by a combination step of removing a portion of the second conductive layer 330 by a photolithographic process and an etching process to form the top portion of the blind hole 302, and removing a portion of the dielectric layer 320 by a laser ablating method or a plasma etching method to formed the bottom portion of the blind hole 302.

Figure 3F:
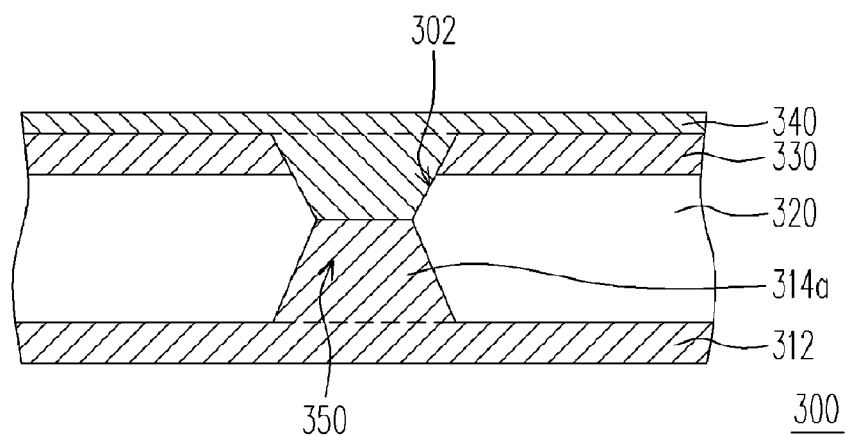

Referring to FIG. 3F, a conductive material, such as copper, fills the blind hole 302 and over the surface of the second conductive layer 330 of the electrical interconnect structure 300 during, for example, an electroplating method to form an electroplating layer 340. Wherein, a portion of the electroplating layer 340 fills in the space within the blind hole 302, constituting a conductive post 350 with the bump 314a.

Accordingly, the conductive post 350 of the first embodiment comprises the bump 314a and the conductive material in the blind hole 302, electrically connecting the first conductive layer 312 and the second conductive layer 330, which are separated by the dielectric layer 320. In the first embodiment, the bump 314a is first formed over the first conductive layer 312, serving as the bottom portion of the conductive post 350. The conductive material filling the blind hole 302 within the dielectric layer 320 constitutes the top portion of the conductive post 350.

For a conductive post 350 with a constant height, the higher the bumper 314a is, the shallower the blind hole 302 is. The shallow depth of the blind hole 302 not only reduces the time for electroplating, but also decreases the possibility of voids formed in the conductive post 350. As a result, the yield of the conductive post 350 is enhanced.

Second Embodiment

The difference between the first and the second embodiments is that in the first embodiment, the bottom portion of the conductive post, i.e. the bump, is formed by a subtractive process, but it is formed by an additive process in the second embodiment.

Figure 4A:
FIGS. 4A-4E are cross-sectional views showing progression of a method for fabricating an electrical interconnect structure according to a second embodiment of the present invention.
Figure 4B:
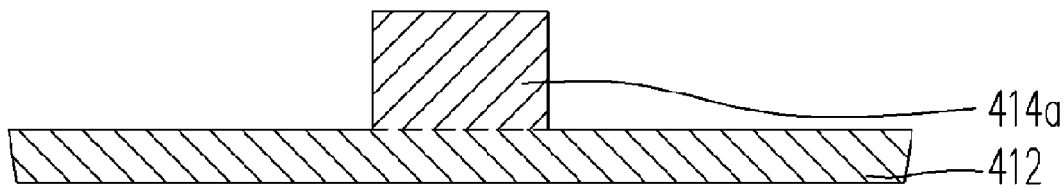

FIGS. 4A-4E are cross-sectional views showing progression of a method for fabricating an electrical interconnect structure according to a second embodiment of the present invention. Referring to FIGS. 4A and 4B, a conductive layer 412 is provided, which can be made of copper. A patterned photoresist layer (not shown) is formed over the conductive layer 412. The conductive layer 412 serves as an electroplating seed layer, and a conductive material is formed in an opening (not shown) of the patterned photoresist layer by, for example, an electroplating method. As a result, at least one bump 414a is formed over the conductive layer 412.

Figure 4C:
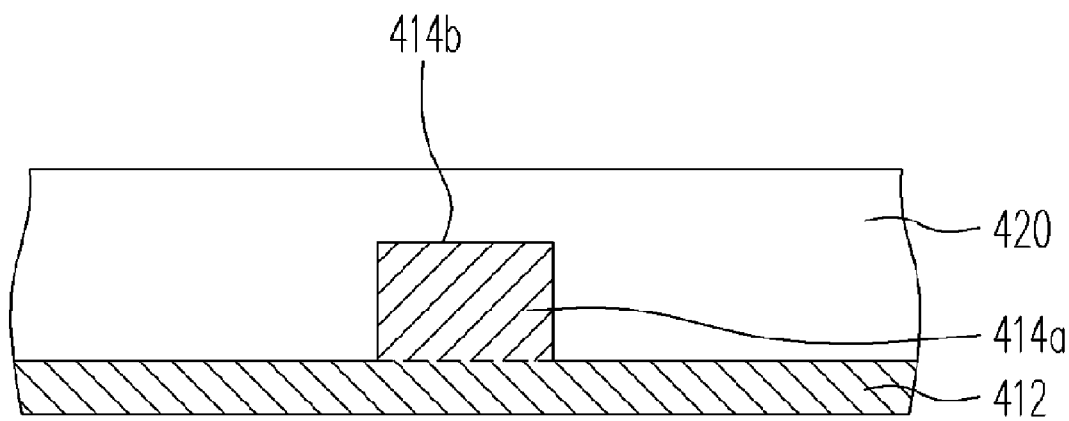

Referring to FIG. 4C, a dielectric layer 420 is formed over the conductive layer 412 and the bump 414a. The dielectric layer 420 covers a top surface 414b of the bump 414a, wherein the material of the dielectric layer 420 can be, for example, epoxy resin or epoxy resin comprising glass fiber. In addition, the method for forming the dielectric layer 420 can be, for example, a film adhesion method, a thermal laminating method, or a coating-and-solidification method.

Figure 4D:
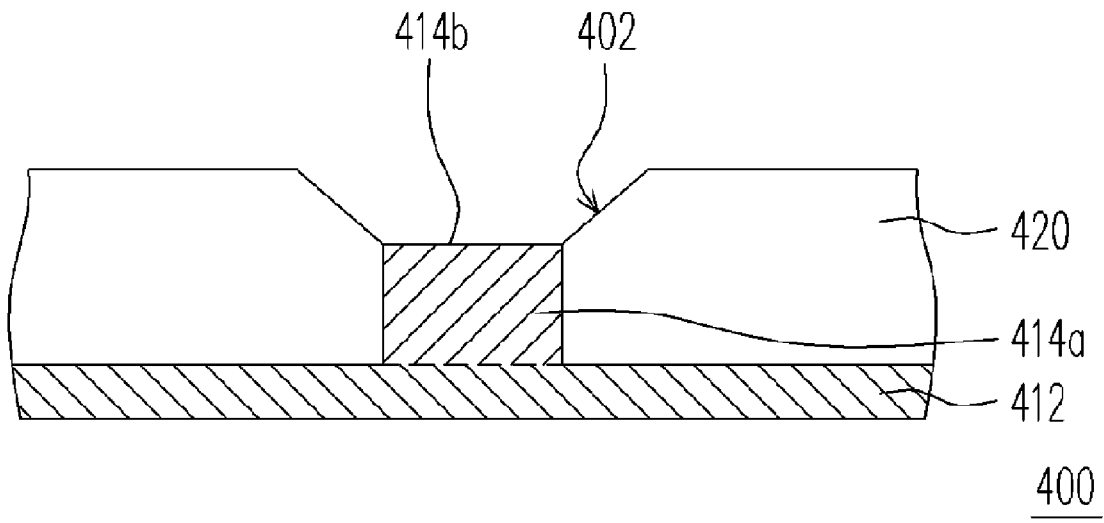

Referring to FIG. 4D, at least one blind hole 402 can be formed in the dielectric layer 420 by, for example, mechanical drilling, laser ablating, or plasma etching method. Moreover, the blind hole 402 passes through the dielectric layer 420 to expose the top surface 414b of the bump 414a.

Figure 4E:
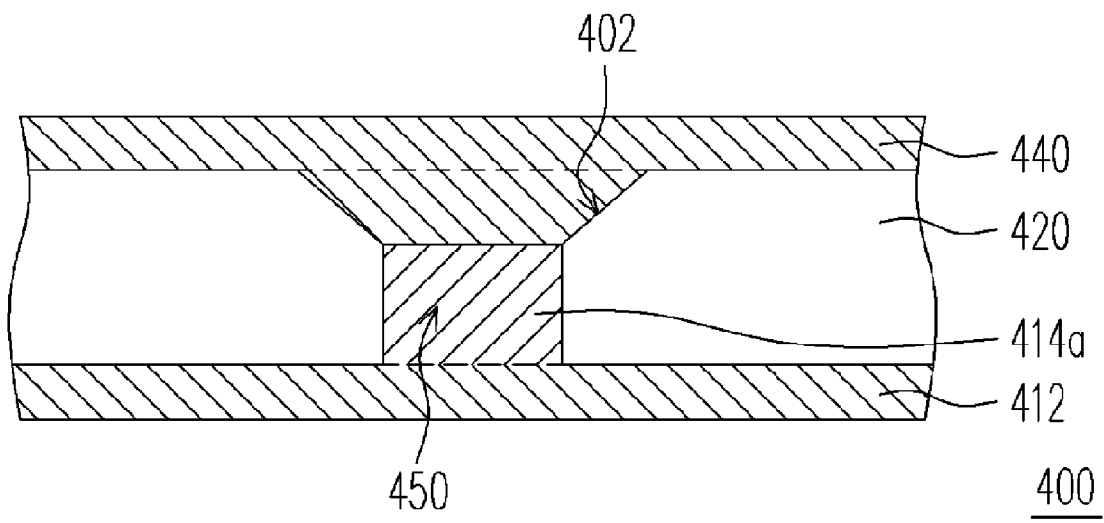

Referring to FIG. 4E, a conductive material, such as copper, fills in the blind hole 402 and over the surface of the dielectric layer 420 of the electrical interconnect structure by, for example, an electroplating method to form an electroplating layer 440. Wherein, a portion of the electroplating layer 440 fills in the space within the blind hole 402, constituting a conductive post 450 with the bump 414a.

Accordingly, the conductive post 450 of the second embodiment comprises the bump 414a and the conductive material in the blind hole 402 to connect the conductive layer 412 and the electroplating layer 440, which are separated by the dielectric layer 420. In the second embodiment, the bump 414a is first formed over the conductive layer 412, serving as the bottom portion of the conductive post 450. The conductive material in the blind hole 402 within the dielectric layer 420 constitutes the top portion of the conductive post 450.

For a conductive post 450 with a constant height, the higher the bumper 414a is, the shallower the depth of the blind hole 402 is. A shallower depth of the blind hole 402 not only reduces the time for electroplating, but also decreases the possibility of voids formed in the conductive post 450. As a result, the yield of the conductive post 450 is enhanced.

Note that, the method of forming the conductive post 350 in the first embodiment can be referred to FIG. 3E, where the electroplating layer 340 is formed over the blind hole 302 and the surface of the second conductive layer 330 of the electrical interconnect structure 300. Alternatively, the electroplating layer 440 can be formed over the blind hole 402 and the surface of the dielectric layer 420 of the electrical interconnect structure 400 without forming the part of the conductive post 350 in the second conductive layer 330 as shown in FIG. 4E. In the electrical interconnect structure 300 of the first embodiment, when the electrical interconnect structure 300 comprises the second conductive layer 330, a thin electroplating layer 340 over the second conductive layer 330 is sufficient to electrically connect the first conductive layer 312 with the second conductive layer 330 through the conductive post 350. In the electrical interconnect structure 400 of the second embodiment, when the electrical interconnect structure 400 does not include the second conductive layer 330, a thick electroplating layer 440 can be formed over the surface of the dielectric layer 420.

The present invention mainly provides the methods for fabricating the electrical interconnect structure according to the first and the second embodiments. Subsequent manufacturing process of the circuit boards with the electrical interconnect structure described above depends on the layers of the circuit board. Detailed descriptions are spared. Regardless of the first or the second embodiment, the conductive post serves not only as the conductive through via, but also as a conductive micro via in the circuit board.

Figure 5:
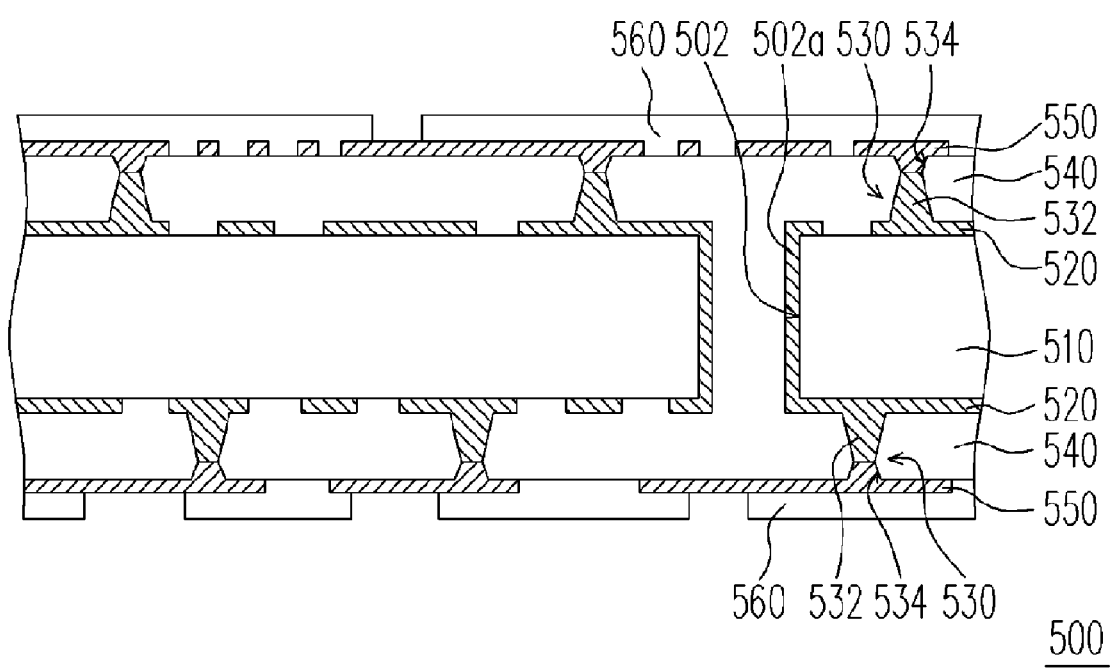
FIG. 5 is a schematic drawing showing a four-conductive-layer circuit board with the electrical interconnect structure according to an embodiment of the present invention.

FIG. 5 is a schematic drawing showing a four-conductive-layer circuit board with the electrical interconnect structure according to an embodiment of the present invention. The circuit board 500 comprises a dielectric layer 510. Each surface of the dielectric layer 510 comprises a conductive layer 520 thereon. At least one through hole 502 passes through the dielectric layer 510 and these conductive layers 520. The conductive material fully deposited on the sidewall of the through hole 502 forms a hollow conductive through via 502a in the through hole 502. After these conductive layers 520 are patterned, bumps 532 are formed over these conductive layers 520. In addition, two dielectric layers 540 are formed over these bumps 532 and conductive layers 520, respectively. Blind holes 534 are formed in these dielectric layers 540 over these bumps 532. The conductive material fully fills in these blind holes 534 and covers surfaces of these dielectric layers 540 to form conductive layers 550. After these conductive layers 550 are patterned, the conductive material filled in these blind holes 534 and these bumps 532 constitute a plurality of conductive posts 530. Accordingly, these conductive layers 520 are able to electrically connect with these conductive layers 550 through these conductive posts 530. Then, two bonding-pad layers 560 are formed over these conductive layers 550. Therefore, any conductive micro vias manufacturing process of the circuit board can adopt the method for fabricating the electrical interconnect structure according to the present invention.

Accordingly, the method for fabricating the electrical interconnect structure of the present invention uses bumps and conductive material in blind holes to form conductive posts which electrically connect two conductive layers separated by the dielectric layer. Compared with the conventional method, in the present invention, a bump is first formed over the conductive layer as a bottom part of the conductive post. The top part of the conductive post is formed by filling the conductive material in the blind hole within the dielectric layer. Accordingly, for the conductive post with a constant height, the higher the bump is, the shallower the blind hole is. The shallow blind hole not only reduces the time for electroplating the blind hole, but also decreases the possibility of voids formed within the conductive post. Accordingly, the yield of conductive posts can be enhanced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method for fabricating an electrical interconnect structure, adapted for a circuit board manufacturing process, the circuit board comprising a conductive substrate, the conductive substrate comprising a first conductive layer and a bump conductive layer, the bump conductive layer being disposed over the first conductive layer, the method comprising:
   patterning the bump conductive layer to form at least one bump over the first conductive layer;
   forming a dielectric layer over the first conductive layer and the bump, the dielectric layer covering a top surface of the bump;
   forming a second conductive layer over the dielectric layer;
   forming at least one blind hole in the second conductive layer and the dielectric layer, the blind hole passing through the second conductive layer and dielectric layer to expose the top surface of the bump; and
   filling a conductive material in the blind hole, the conductive material in the blind hole and the bump constituting a solid conductive post.

2. The method for fabricating an electrical interconnect structure of claim 1, wherein the blind hole is formed by a mechanical drilling method.

3. The method for fabricating an electrical interconnect structure of claim 1, wherein the blind hole is formed by a laser ablating method.

4. The method for fabricating an electrical interconnect structure of claim 1, wherein the blind hole is formed by a plasma etching method.

5. The method for fabricating an electrical interconnect structure of claim 1, wherein the conductive material is filled in the blind hole by an electroplating method.

6. A method for fabricating an electrical interconnect structure, adapted for a circuit board manufacturing process, the circuit board comprising a first conductive layer, the method comprising:
   forming at least one bump over the first conductive layer;
   forming a dielectric layer over the first conductive layer and the bump, the dielectric layer covering a top surface of the bump;
   forming a second conductive layer over the dielectric layer;
   forming at least one blind hole in the second conductive layer and the dielectric layer, the blind hole passing through the second conductive layer and dielectric layer to expose the top surface of the bump; and
   filling a conductive material in the blind hole, the conductive material in the blind hole and the bump constituting a solid conductive post.

7. The method for fabricating an electrical interconnect structure of claim 6, wherein before the bump is formed over the first conductive layer, the first conductive layer is patterned.

8. The method for fabricating an electrical interconnect structure of claim 6, wherein the blind hole is formed by a mechanical drilling method.

9. The method for fabricating an electrical interconnect structure of claim 6, wherein the blind hole is formed by a laser ablating method.

10. The method for fabricating an electrical interconnect structure of claim 6, wherein the blind hole is formed by a plasma etching method.

11. The method for fabricating an electrical interconnect structure of claim 6, wherein the conductive material is filled in the blind hole by an electroplating method.

\* \* \* \* \*